United States Patent
Chiang et al.

(10) Patent No.: US 8,124,466 B2
(45) Date of Patent: Feb. 28, 2012

(54) PROCESS FOR MANUFACTURING VOLTAGE-CONTROLLED TRANSISTOR

(75) Inventors: Chiu-Chih Chiang, Hsinchu (TW); Chih-Feng Huang, Hsinchu County (TW)

(73) Assignee: System General Corp., Taipei Hsien (TW)

( * ) Notice: Subject to any disclaimer, the term of this patent is extended or adjusted under 35 U.S.C. 154(b) by 0 days.

(21) Appl. No.: 12/132,605

(22) Filed: Jun. 3, 2008

(65) Prior Publication Data

US 2008/0248638 A1   Oct. 9, 2008

Related U.S. Application Data

(62) Division of application No. 11/424,532, filed on Jun. 15, 2006, now abandoned.

(51) Int. Cl.
   *H01L 21/336* (2006.01)
(52) U.S. Cl. ............... 438/197; 257/343; 257/E21.373; 438/236; 438/298
(58) Field of Classification Search .................. 257/343, 257/335, 336, 341, 392, E21.373; 438/142, 438/542, 197, 236, 298
See application file for complete search history.

(56) References Cited

U.S. PATENT DOCUMENTS

| | | | | |
|---|---|---|---|---|
| 5,432,371 A * | 7/1995 | Denner et al. | ................ | 257/409 |
| 5,622,880 A * | 4/1997 | Burr et al. | ................ | 438/194 |
| 6,365,940 B1 * | 4/2002 | Duvvury et al. | ............. | 257/356 |
| 6,559,504 B2 * | 5/2003 | Nishibe et al. | ................ | 257/343 |
| 6,873,011 B1 * | 3/2005 | Huang et al. | ................ | 257/345 |
| 6,979,850 B2 * | 12/2005 | Hatade | ................ | 257/296 |
| 2003/0034531 A1 * | 2/2003 | Kanda et al. | ................ | 257/392 |

* cited by examiner

*Primary Examiner* — Robert Huber
(74) *Attorney, Agent, or Firm* — Jianq Chyun IP Office

(57) ABSTRACT

The present invention provides a self-driven LDMOS which utilizes a parasitic resistor between a drain terminal and an auxiliary region. The parasitic resistor is formed between two depletion boundaries in a quasi-linked deep N-type well. When the two depletion boundaries pinch off, a gate-voltage potential at a gate terminal is clipped at a drain-voltage potential at said drain terminal. Since the gate-voltage potential is designed to be equal to or higher than a start-threshold voltage, the LDMOS is turned on accordingly. Besides, no additional die space and masking process are needed to manufacture the parasitic resistor. Furthermore, the parasitic resistor of the present invention does not lower the breakdown voltage and the operating speed of the LDMOS. In addition, when the two depletion boundaries pinch off, the gate-voltage potential does not vary in response to an increment of the drain-voltage potential.

5 Claims, 3 Drawing Sheets

United States Patent US 8,124,466 B2

PROCESS FOR MANUFACTURING VOLTAGE-CONTROLLED TRANSISTOR

CROSS-REFERENCE TO RELATED APPLICATION

This application is a divisional of an application Ser. No. 11/424,532, filed on Jun. 15, 2006, now pending. The entirety of each of the above-mentioned patent applications is hereby incorporated by reference herein and made a part of this specification.

BACKGROUND OF THE INVENTION

1. Field of the Invention

The present invention relates to a semiconductor manufacturing process, more particularly, the present invention relates to an LDMOS transistor manufacturing process.

2. Description of Related Art

Self-driven LDMOS transistor technologies have been proposed, wherein one technology includes adjustment of a start-threshold voltage of an LDNMOS transistor, for instance, to a lower voltage potential with additional ion implantation. However, the disadvantage of this technology is higher leakage current, lowered breakdown voltage, and additional masking process cost. Another technology utilizes a parasitic drain-to-gate capacitor to couple a gate-voltage potential to make a self-driven LDMOS transistor. However, the capacitance of the parasitic drain-to-gate capacitor varies in response to a depletion capacitor connected in series, which fails to accurately control the gate-voltage potential at a required voltage potential. Yet another technology utilizes a voltage divider having a high resistance poly resistor between a gate and a drain of the LDMOS transistor and a resistor connected from the gate to a substrate to provide a gate-voltage potential for turning on the LDMOS transistor. However, the disadvantages of this invention include high resistance variation of the poly resistor, additional masking process cost, and larger occupied die space.

SUMMARY OF THE INVENTION

The present invention propose a self-driven LDMOS transistor, which utilizes a parasitic resistor between a drain terminal and an auxiliary region. The parasitic resistor is formed between two depletion boundaries. A gate-voltage potential of the LDMOS transistor is clipped at a drain-voltage potential at the drain terminal when two depletion boundaries pinch off. Since the gate-voltage potential is designed to be equal to or higher than a start-threshold voltage of the LDMOS transistor, the LDMOS transistor will be turned on accordingly.

According to the present invention, no additional masking process and no additional die space are needed to manufacture the parasitic resistor. Furthermore, the parasitic resistor of the present invention doesn't lower the breakdown voltage and the operating speed of the LDMOS transistor. Besides, when the two depletion boundaries pinch off, the gate-voltage potential no longer varies in response to an increment of the drain-voltage potential.

It is to be understood that both the foregoing general descriptions and the following detailed descriptions are exemplary, and are intended to provide further explanation of the invention as claimed. Still further objects and advantages will become apparent from a consideration of the ensuing description and drawings.

BRIEF DESCRIPTION OF THE DRAWINGS

The accompanying drawings are included to provide further understanding of the invention, and are incorporated into and constitute a part of this specification. The drawings illustrate embodiments of the invention and, together with the description, serve to explain the principles of the invention.

DETAILED DESCRIPTION OF THE INVENTION

Figure 1:
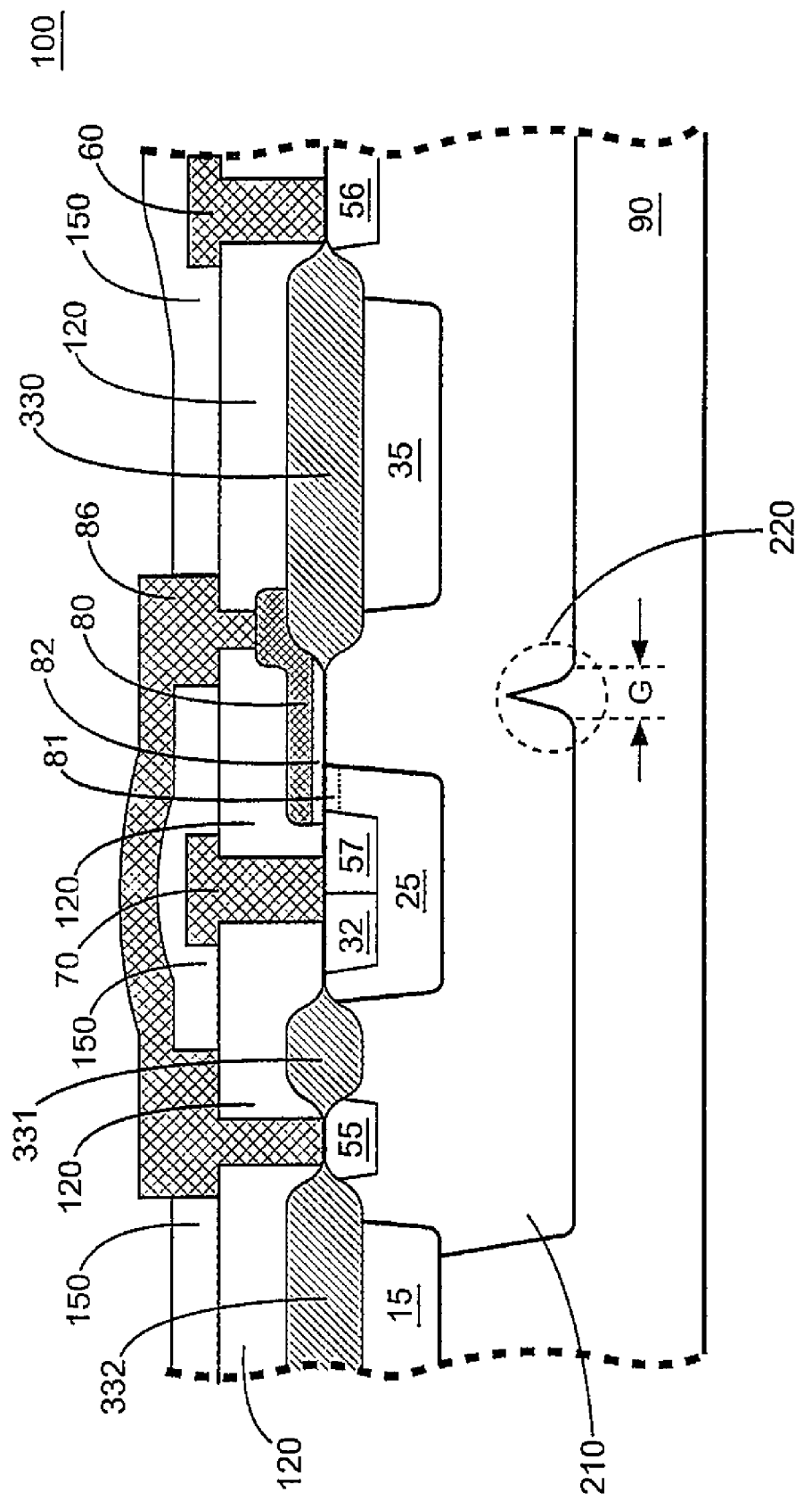
FIG. 1 shows a cross sectional view of a self-driven LDMOS transistor according to an embodiment of the present invention.

FIG. 1 shows a cross sectional view of a self-driven LDMOS transistor 100 according to a preferred embodiment of the present invention. The LDMOS transistor 100 comprises a P-type substrate 90 with resistivity ranging from 10 ohm-cm to 100 ohm-cm. A quasi-linked deep N-type well 210 having N-type conductive ions is formed in the P-type substrate 90. The doping concentration of the quasi-linked deep N-type well 210 ranges from $1.7E17/cm^3$ to $8.3E18/cm^3$. The depth of the quasi-linked deep N-type well 210 ranges from 2 µm to 10 µm. The quasi-linked N-type well 210 has a gap with a width G, which ranges from 2 µm to 20 µm.

As shown in FIG. 1, the quasi-linked deep N-type well 210 has a discontinuous polarity distribution structure 220, which consists of a partial quasi-linked deep N-type well 210 and a partial P-type substrate 90. The discontinuous polarity distribution structure 220 is in parallel to a conduction channel 81 of the LDMOS transistor 100. A P-type well 35, which can be implemented with a P-type body, and a P-type well 25 having P-type conductive ions are formed in the quasi-linked deep N-type well 210. The doping concentration of the P-type wells 25 and 35 range from $3.3E17/cm^3$ to $1E19/cm^3$. The depth of the P-type wells 25 and 35 range from 1 µm to 5 µm. Field oxides 330, 331, and 332 are formed to serve as isolation structures.

A gate oxide layer 82 is formed over the conduction channel 81. The thickness of the gate oxide layer 82 ranges from 300 Å to 1000 Å. A polysilicon gate layer 80 is formed over the gate oxide layer 82 and the field oxide 330 for controlling a current flow in the conduction channel 81.

The LDMOS transistor 100 further comprises N+-type regions 55, 56 and 57 with a doping concentration higher than that of the quasi-linked deep N-type well 210, which range from $1E22/cm^3$ to $5E23/cm^3$. The N+-type region 55 forms an auxiliary region in the quasi-linked deep N-type well 210. The N+-type region 56 forms a drain region in the quasi-linked deep N-type well 210. The N+-type region 57 forms a source region in the P-type well 25. A P+-type region 32 having a doping concentration higher than that of P-type wells 25 and 35, which ranges from $1E22/cm^3$ to $5E23/cm^3$, forms a contact region in the P-type well 25.

Next, a dielectric layer 120 is formed over the P-type substrate 90. An electrode 60, such as metal layer, connects with the drain region to form a drain terminal of the LDMOS transistor 100. An electrode 70, such as metal layer, connects with the source region and the contact region to form a source terminal of the LDMOS transistor 100. A dielectric layer 150 is formed over the P-type substrate 90. An electrode 86, such as metal layer, connects with the auxiliary region and the polysilicon gate layer 80, which equalizes a voltage potential for the polysilicon gate layer 80 and the auxiliary region.

Figure 2:
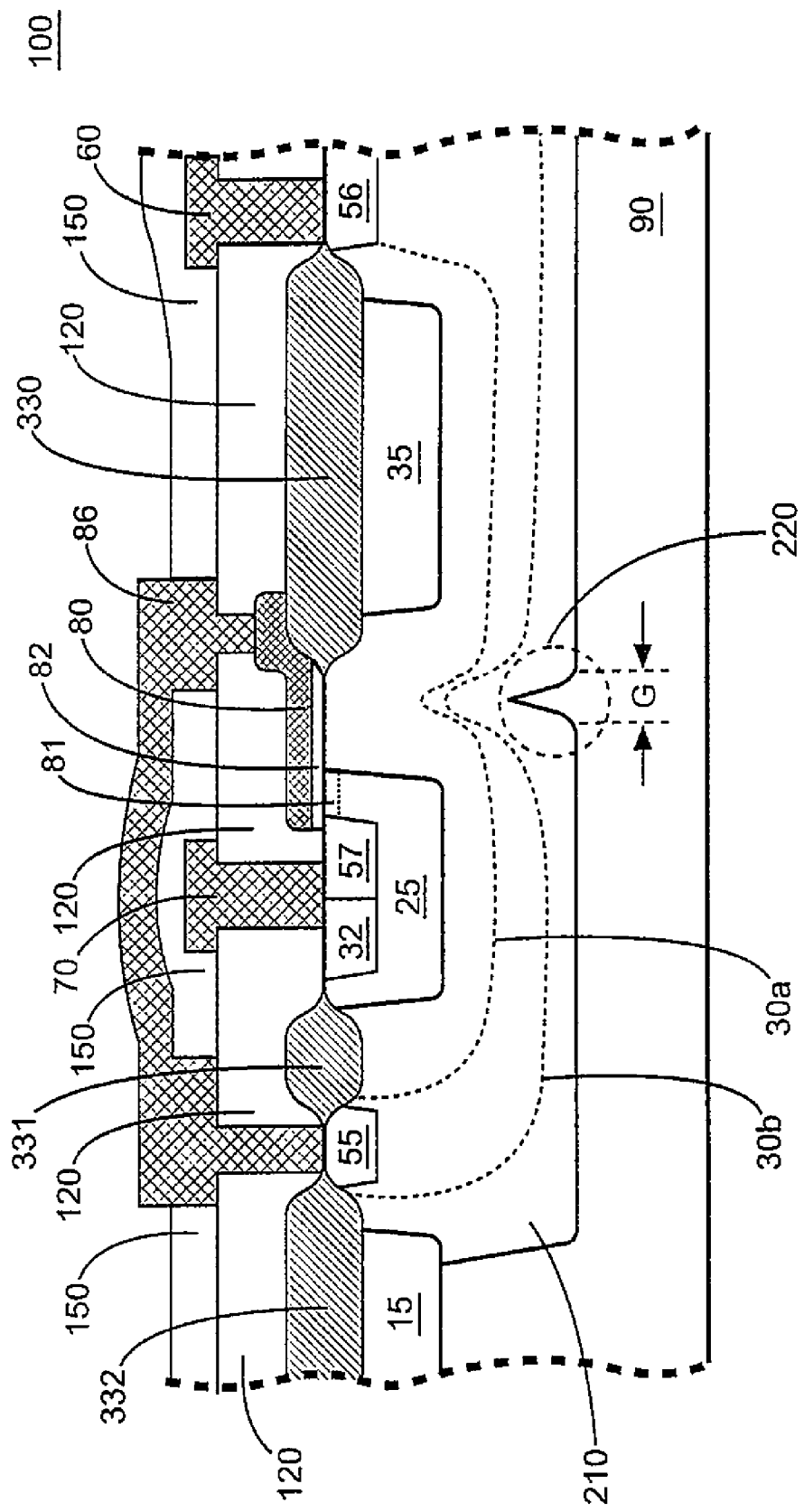
FIG. 2 shows a cross sectional view of the self-driven LDMOS transistor with two depletion boundaries according to an embodiment of the present invention.
Figure 3:
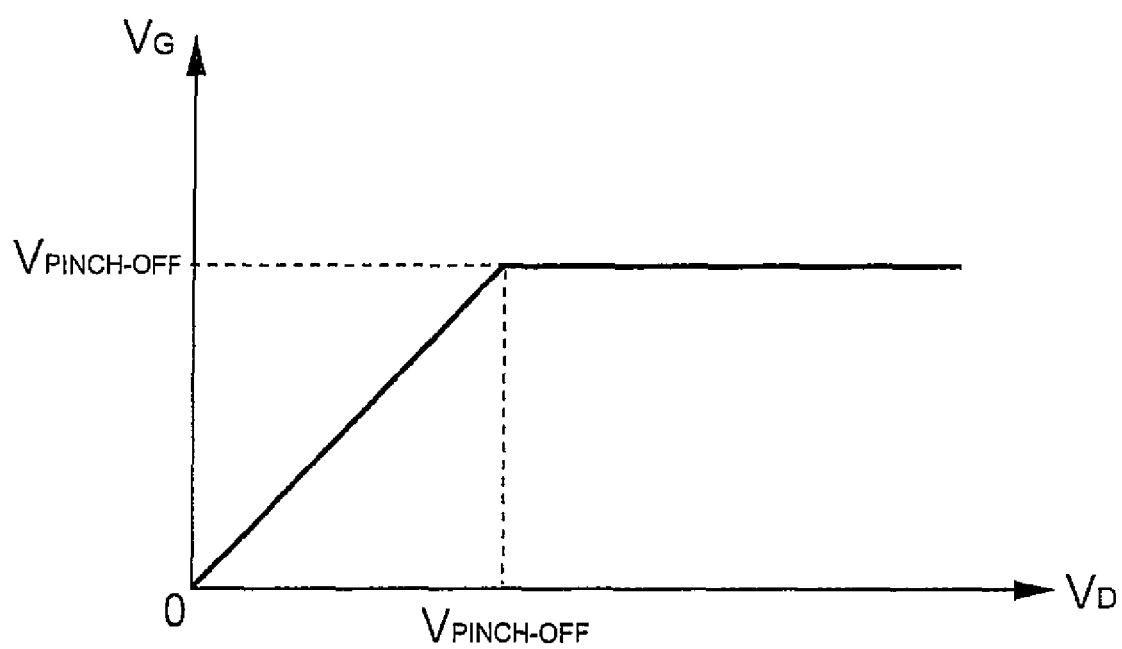
FIG. 3 shows a characteristic property of a gate-voltage potential and a drain-voltage potential of the self-driven LDMOS transistor.

Referring to FIG. 2 and FIG. 3, when a positive voltage potential is applied to the drain terminal of the LDMOS transistor 100, a drain-voltage potential $V_D$ at the drain terminal of the transistor 100 will be conducted via the quasi-linked deep N-type well 210 to build a gate-voltage potential $V_G$ at the polysilicon gate layer 80. As shown in FIG. 3, the gate-voltage potential $V_G$ increases in linear proportion to the drain-voltage potential $V_D$.

Since a positive voltage potential applied to the drain terminal of the LDMOS transistor 100 results in an inversed bias voltage, two depletion boundaries 30a and 30b will be formed and begin to approach each other when the drain-voltage potential $V_D$ continuously increases. A parasitic resistor is formed between the drain terminal and the auxiliary region. The resistance of the parasitic resistor varies according to an average distance between the two depletion boundaries 30a and 30b. When the two depletion boundaries 30a and 30b pinch off, which is defined as a pinch-off situation, the gate-voltage potential $V_G$ at the polysilicon gate layer 80 is no longer increased. Meanwhile, the gate-voltage potential $V_G$ is clipped at a predetermined voltage potential $V_{PINCH-OFF}$, which is designed to be equal to or higher than a start-threshold voltage of the LDMOS transistor 100. Therefore, the LDMOS transistor 100 will be turned on accordingly. Moreover, when the two depletion boundaries 30a and 30b pinch off, the impedance of the parasitic resistor is high and therefore an extremely low leakage current of the LDMOS transistor 100 is achieved. As a result, the standby power consumption of the LDMOS transistor 100 can be dramatically reduced. The operating efficiency of the LDMOS transistor is therefore improved.

The two depletion boundaries 30a and 30b facilitate to form a pinch-off structure with the gap having the width G of the quasi-linked deep N-type well 210. Besides, the LDMOS transistor 100 is a voltage-controlled transistor and doesn't need external circuit, which might occupy extra die space, to form a self-driven structure. This further reduces the manufacturing cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process for manufacturing a voltage-controlled transistor, comprising:
    providing a substrate;
    forming a quasi-linked deep well in said substrate, wherein the quasi-linked deep well is a single and continuous deep well, and is configured with a recess at an interface between the quasi-linked deep well and the substrate, wherein a mouth of the recess at the interface between the quasi-linked deep well and the substrate has a width ranging from 2 μm to 20 μm;
    forming a well with complementary doping polarity to that of said quasi-linked deep well in said substrate;
    forming an oxide layer over said substrate for serving as isolation structures;
    forming a gate-oxide layer over said quasi-linked deep well;
    forming heavy doping regions in said well with complementary doping polarity to that of said quasi-linked deep well;
    forming a polysilicon gate layer over the gate-oxide layer;
    forming an auxiliary region in the quasi-linked deep well;
    forming an electrode layer connecting with the auxiliary region and the polysilicon gate layer; and
    forming a conduction region in said well with complementary doping polarity to that of said quasi-linked deep well underlying a gate of said voltage-controlled transistor and near said quasi-linked deep well, wherein the conduction region is formed next to one of heavy doping regions.

2. The process as claimed in claim 1, wherein the step of forming said quasi-linked deep well further comprises a step of performing a thermal driving process at 1000° C.~1200° C. for 6~12 hours.

3. The process as claimed in claim 1, wherein the step of forming said well with complementary doping polarity to that of said quasi-linked deep well further comprises performing a thermal driving process at 900° C.~1100° C. for 2~6 hours.

4. The process as claimed in claim 1, wherein the recess is filled in by the substrate.

5. The process as claimed in claim 1, wherein the recess is configured with a reverse V-shape.

* * * * *